(12) United States Patent
Sugizaki et al.

(10) Patent No.: US 9,562,808 B2
(45) Date of Patent: Feb. 7, 2017

(54) LIGHT RECEIVING CIRCUIT AND LIGHT COUPLING DEVICE

(71) Applicant: KABUSHIKI KAISHA TOSHIBA, Tokyo (JP)

(72) Inventors: Masayuki Sugizaki, Kanagawa (JP); Shigeyuki Sakura, Kanagawa (JP); Toyoaki Uo, Fukuoka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 149 days.

(21) Appl. No.: 14/634,245

(22) Filed: Feb. 27, 2015

(65) Prior Publication Data

US 2016/0061658 A1 Mar. 3, 2016

(30) Foreign Application Priority Data

Aug. 29, 2014 (JP) .................................. 2014-176591

(51) Int. Cl.

| H01J 40/14 | (2006.01) |
|---|---|
| G01J 1/44 | (2006.01) |
| H04B 10/80 | (2013.01) |
| H03F 1/08 | (2006.01) |
| H03F 1/22 | (2006.01) |
| H03F 3/08 | (2006.01) |

(52) U.S. Cl.
CPC ................ G01J 1/44 (2013.01); H03F 1/086 (2013.01); H03F 1/223 (2013.01); H03F 3/082 (2013.01); H04B 10/802 (2013.01); *G01J 2001/446* (2013.01)

(58) Field of Classification Search
CPC ........... H03F 3/08; H03F 3/082; H03F 1/0205

USPC .......... 250/214 R, 214 A, 214 LA, 214 AG; 330/59, 308

See application file for complete search history.

(56) References Cited

U.S. PATENT DOCUMENTS

| 5,386,109 A | 1/1995 | Ikeuchi et al. | |
|---|---|---|---|
| 8,674,770 B2 | 3/2014 | Takiba et al. | |
| 8,847,140 B2* | 9/2014 | Sugizaki | H04B 10/695 |
| | | | 250/214 LA |
| 2013/0234007 A1 | 9/2013 | Sugizaki et al. | |
| 2016/0268982 A1* | 9/2016 | Sugizaki | H03F 3/082 |

FOREIGN PATENT DOCUMENTS

JP 2005-210558 A 8/2005

* cited by examiner

*Primary Examiner* — Kevin Pyo
(74) *Attorney, Agent, or Firm* — Patterson & Sheridan, LLP

(57) ABSTRACT

A light receiving circuit includes a light receiving element, a first transistor that includes a control terminal which is connected to the light receiving element through a first node, a first terminal and a second terminal, a first load circuit that is connected between a power supply potential and a second node connected to the second terminal, and outputs a voltage signal to a third node, wherein the voltage signal is based on a current signal in the light receiving element, a first feedback resistor that is connected between the first node and the third node, a first limiter circuit that is connected in parallel with the first feedback resistor, and limits an increase of voltage at both ends of the first feedback resistor, and a first circuit that is connected between the second node and the reference potential, includes a second transistor which is diode-connected.

20 Claims, 10 Drawing Sheets

LIGHT RECEIVING CIRCUIT AND LIGHT COUPLING DEVICE

CROSS-REFERENCE TO RELATED APPLICATION

This application is based upon and claims the benefit of priority from Japanese Patent Application No. 2014-176591, filed Aug. 29, 2014, the entire contents of which are incorporated herein by reference.

FIELD

Embodiments described herein relate to a light receiving circuit and a light coupling device.

BACKGROUND

In recent years, in a device which transmits a signal using light, such as a light coupling element or a light data link, characteristics such as a light emitting efficiency of a light emitting element have improved, and transmission loss of plastic light fiber, which forms a light transmission line, also has been decreased. For this reason, such a device makes it possible to perform high capacity and low cost light data communication. In such light data communication environment, it is necessary to increase the dynamic range of a light receiving circuit and to maintain stable operation over a wide operation range.

As transmission distance of a light transmission line increases, the strength of a light signal to be transmitted ranges from a very low level to a very high level, so that increasing the dynamic range of a light receiving circuit poses a serious problem. For example, in a light receiving circuit that includes a light receiving element and a trans-impedance amplifier (TIA) at an input stage, if a very low level light signal is received, the gain of the trans-impedance amplifier may be set accordingly, but if signal strength is also strong (or becomes strong), the trans-impedance amplifier becomes saturated, and oscillation may occur. Thus, it is difficult to expand a dynamic range of a light receiving circuit.

DETAILED DESCRIPTION

Embodiments provide a light receiving circuit and a light coupling device that have stable operation over a wide dynamic range.

According to an embodiment, a light receiving circuit includes a light receiving element connected to a first node. A first transistor has a control terminal (e.g., gate electrode) that is connected to the light receiving element through the first node, a first terminal that is connected to a first reference potential (e.g., ground potential), and a second terminal that is connected to a second node. A first load circuit is connected between the second node and a first power supply potential (e.g., Vdd) that is higher than the first reference potential. The first load circuit is configured to output a voltage signal to a third node. The voltage signal output by the first load circuit corresponds to a current signal generated by the light receiving element. The current signal generated by the light receiving element generally corresponds to a light signal supplied to the light receiving circuit. A first feedback resistor is connected between the first node and the third node. A first limiter circuit is connected in parallel with the first feedback resistor and is configured to limit an increase in voltage across the first feedback resistor. A second transistor is a diode-connected connected transistor and is connected between the second node and the first reference potential.

In general, according to one embodiment, a light receiving circuit includes: a light receiving element; a first transistor that includes a control terminal which is connected to the light receiving element through a first node, a first terminal which is connected to a reference potential, and a second terminal; a first load circuit that is connected between a power supply potential higher than the reference potential and a second node connected to the second terminal, and outputs a voltage signal to a third node wherein the voltage signal is based on current signal in the light receiving element; a first feedback resistor that is connected between the first node and the third node; a first limiter circuit that is connected in parallel with the first feedback resistor, and limits an increase of voltage at both ends of the first feedback resistor; and a first circuit that is connected between the second node and the reference potential, includes a second transistor which is diode-connected.

Hereinafter, embodiments of the present disclosure are described with reference to the drawings.

First Embodiment

Figure 1:
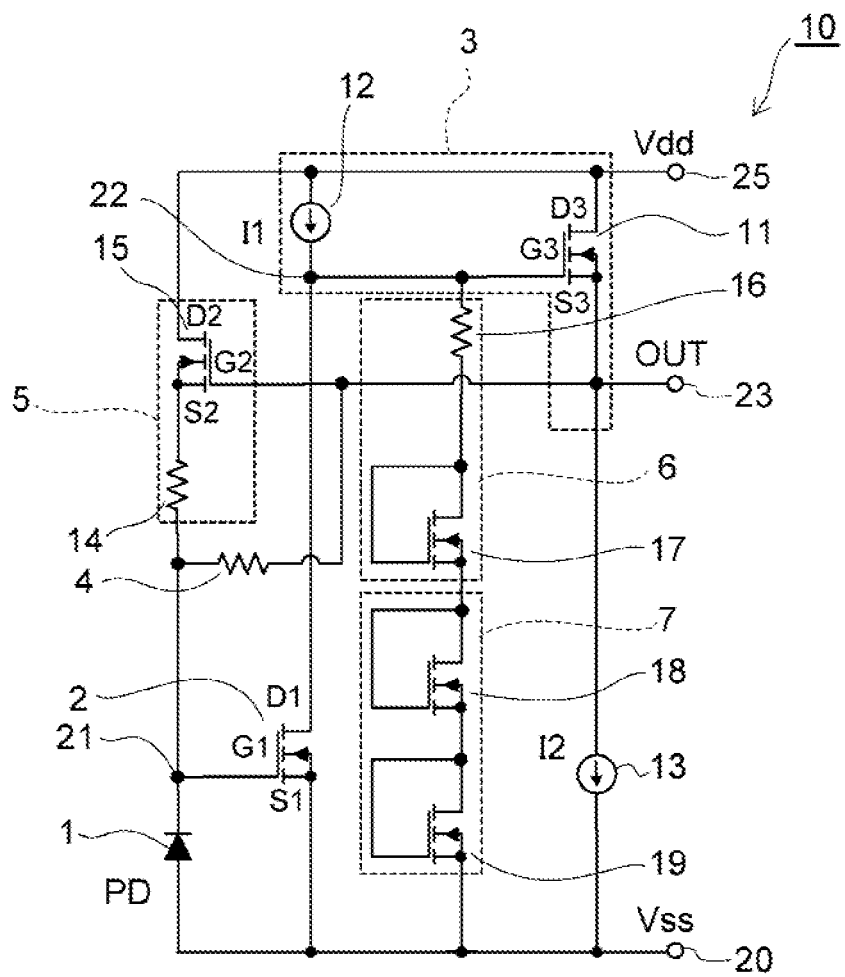
FIG. 1 is a circuit diagram illustrating a light receiving circuit according to a first embodiment.

As illustrated in FIG. 1, the light receiving circuit 10 according to a first embodiment includes a light receiving element 1 (PD), an inverting amplification transistor 2, a load circuit 3, a feedback resistor 4, a limiter circuit 5, a by-pass circuit 6, and a by-pass control circuit 7.

The light receiving circuit 10 is connected between a reference potential Vss (at node 20) and a power supply potential Vdd (at node 25). Reference potential Vss may be referred to as "reference potential 20" and power supply potential Vdd may be referred to as "power supply potential 25" for ease of explanation. The reference potential 20 is typically a lowest potential among the potentials to which the light receiving circuit 10 is connected, and is typically a ground voltage (0 V). The power supply potential 25 is typically a highest potential, for example, 3.3 V, among the potentials to which the light receiving circuit 10 is connected. The reference potential 20 and the power supply potential 25 may be maintained in the potential relationship described above, or one or both of the reference potential 20 and the power supply potential 25 may have a negative potential.

The light receiving element 1 is connected between the reference potential 20 and an input node 21 (first node) to which an output current of the light receiving element 1 is supplied. The light receiving element 1 is, for example, a silicon photo diode. The light receiving element 1 may alternatively be a photoelectric conversion element, such as a silicon PIN photo diode or an avalanche photo diode according to a light transmission distance or communication speed, instead of the silicon photo diode.

The inverting amplification transistor 2 includes a gate terminal G1 (control terminal) that is connected to the input node 21, a source terminal S1 (first terminal) that is connected to the reference potential 20, and a drain terminal D1 (second terminal) that inverts and outputs a voltage which is input to the gate terminal G1. The drain terminal D1 of the inverting amplification transistor 2 is directly connected to an internal output node 22 (second node). The inverting amplification transistor 2 is, for example, a metal oxide semiconductor field effect transistor (MOSFET).

The load circuit 3 includes a current source 12 and a load transistor 11. The current source 12 is connected between the power supply potential 25 and the internal output node 22 and supplies a current I1. The load transistor 11 includes a gate terminal G3 that is connected to the internal output node 22 (second node), a source terminal S3 that is connected to an output node 23 (third node) of the light receiving circuit 10, and a drain terminal D3 that is connected to the power supply potential 25. The load transistor 11 is, for example, a MOSFET. The load transistor 11 generates an output from the internal output node 22 via a buffer circuit that performs a current amplification operation together with a current source 13. The current source 13 is connected between the output node 23 (third node) and the reference potential 20 and supplies a current I2. The load circuit 3 receives an output of the inverting amplification transistor 2 in a "source follower" manner, and may connect to a circuit in a subsequent stage at a low output impedance.

In addition, while it is typically preferable that the current sources be a constant current circuit such as a current mirror circuit, the current sources (or at least one current source) may be a resistor element(s). In the present disclosure, a "current source" includes both a constant current circuit and a resistor element used as a current source.

The feedback resistor 4 is connected between the input node 21 and the output node 23. Thus, the light receiving circuit 10 includes a trans-impedance amplifier that includes the feedback resistor 4 and an inverting amplifier that includes the inverting amplification transistor 2, the load circuit 3, and the current source 13.

The limiter circuit 5 includes a feedback resistor 14 and a limiter transistor 15. The feedback resistor 14 includes one terminal that is connected to a source terminal S2 of the limiter transistor 15 and another terminal that is connected to the input node 21. The limiter transistor 15 includes a gate terminal G2 that is connected to the output node 23, and includes a drain terminal D2 that is connected to the power supply potential 25. The feedback resistor 14 is connected to the output node 23 via a gate-source voltage of the limiter transistor 15, and thus the feedback resistor 14 is connected substantially in parallel with the feedback resistor 4.

If the light receiving element 1 receives light and generates a current, the generated current flows into the feedback resistor 4. If the received light intensity of the light receiving element 1 is small, then the current flowing through the feedback resistor 4 is small, and a voltage at both ends of the feedback resistor 4 is lower than a threshold voltage of the limiter transistor 15. For this reason, a potential at the output node 23 increases according to the current flowing through the feedback resistor 4. The threshold voltage of the limiter transistor 15 is set in such a manner that the limiter transistor 15 does not turn on within a range where an output voltage of the load transistor 11 is not saturated. If the current output from the light receiving element 1 increases and a voltage across the feedback resistor 4 exceeds the threshold voltage of the limiter transistor 15, the limiter transistor 15 will turn on. When the limiter transistor 15 turns on, an increase of the voltage across the feedback resistor 4 is consequently limited. For this reason, an increase of the potential at the output node 23 is limited. Thus, if a large photocurrent is generated, the limiter circuit 5 operates in such a manner that an output signal output from the output node 23 is not saturated. In addition, as is described in detail later, the limiter circuit 5 is connected to the feedback resistor 4, and thus, in a state where the limiter circuit 5 operates, an equivalent feedback resistor (resistance) including an effect from the limiter circuit 5 is formed. The resistance value of the equivalent feedback resistor is lower than a resistance value of the feedback resistor 4.

The by-pass circuit 6 includes a resistor 16 and a by-pass transistor 17 that is diode-connected. The bypass circuit 6 is connected between the internal output node 22 and the by-pass control circuit 7. The by-pass transistor 17 is connected in such a manner that a forward current flows from the internal output node 22 to the by-pass control circuit 7. The resistor 16 sets a value of the current that flows when the by-pass transistor 17 turns on.

The by-pass control circuit 7 includes two by-pass transistors 18 and 19, each diode-connected. The by-pass control circuit 7 is connected between the by-pass circuit 6 and the reference potential 20. The by-pass transistors 18 and 19 are connected in series to each other, and are connected in such a manner that a forward current flows from the by-pass circuit 6 to the reference potential 20. Thus, the three by-pass transistors 17 to 19 are connected in series to each other in such a manner that a forward current flows from the internal output node 22 to the reference potential 20.

An operation of the light receiving circuit 10 according to the present embodiment is next described.

When there is no signal, the light receiving element 1 generates no current, and thus current does not flow through the feedback resistor 4. Therefore, the potential at the output node 23 is equal to the potential at the input node 21. The potential at the internal output node 22 is equal to the sum of a gate-source voltage of the inverting amplification transistor 2 and a gate-source voltage of the load transistor 11.

When the light receiving element 1 receives light, the light receiving element generates a current and the generated current flows from the output node 23 to the input node 21 via the feedback resistor 4.

If the received light intensity is increased and the voltage across the feedback resistor 4 increases beyond a predetermined level, the limiter transistor 15 turns on, the voltage across the feedback resistor 4 is consequently limited, and a signal output from the output node 23 is prevented from saturating.

If the threshold voltage of the limiter transistor 15 is set to Vt2, a potential Vn2 at the internal output node 22 is as follows:

$$Vn2=Vgs1+Vt2+Vgs3 \qquad (1)$$

wherein, Vgs1 is a gate-source voltage of the inverting amplification transistor 2 and Vgs3 is a gate-source voltage of the load transistor 11.

If the threshold voltages of all the transistors are equal, the gate-source voltage of the limiter transistor 15 exceeds the threshold voltage Vt2, and thus current does not flow through the by-pass transistors 17 to 19 until the limiter transistor 15 turns on.

If a large light signal is input (received at PD) and a current flows through the feedback resistor 4 so as to turn on the limiter transistor 15, the potential Vn2 of the internal output node 22 increases and the by-pass transistors 17 to 19 turn on. When the by-pass transistors 17 to 19 turn on, the increase of the potential Vn2 at the internal output node 22 is limited. Then, in the light receiving circuit 10, a pole of the transfer function formed by a capacitor between the terminals of the light receiving element 1 and the equivalent feedback resistor is formed near a pole of the transfer function of the inverting amplifier, which includes the inverting amplification transistor 2, the load circuit 3, and the current source 13. Thus, the light receiving circuit 10 maintains stable operation over a wide frequency range.

In addition, the limiter transistor 15 is not required to turn on exactly at the same time as the by-pass transistors 17 to 19. As illustrated above, a cause of an unstable system is that when the limiter transistor 15 turns on the value of the equivalent feedback resistance is decreased, and the pole of the transfer function formed by the capacitor between the terminal of the light receiving element 1 and the equivalent feedback resistance is near a pole of the transfer function of the inverting amplifier, which includes the inverting amplification transistor 2, the load circuit 3, and the current source 13. Thus, even before the limiter transistor 15 turns on, the current may flow through the by-pass transistors 17 to 19.

Figure 2A:
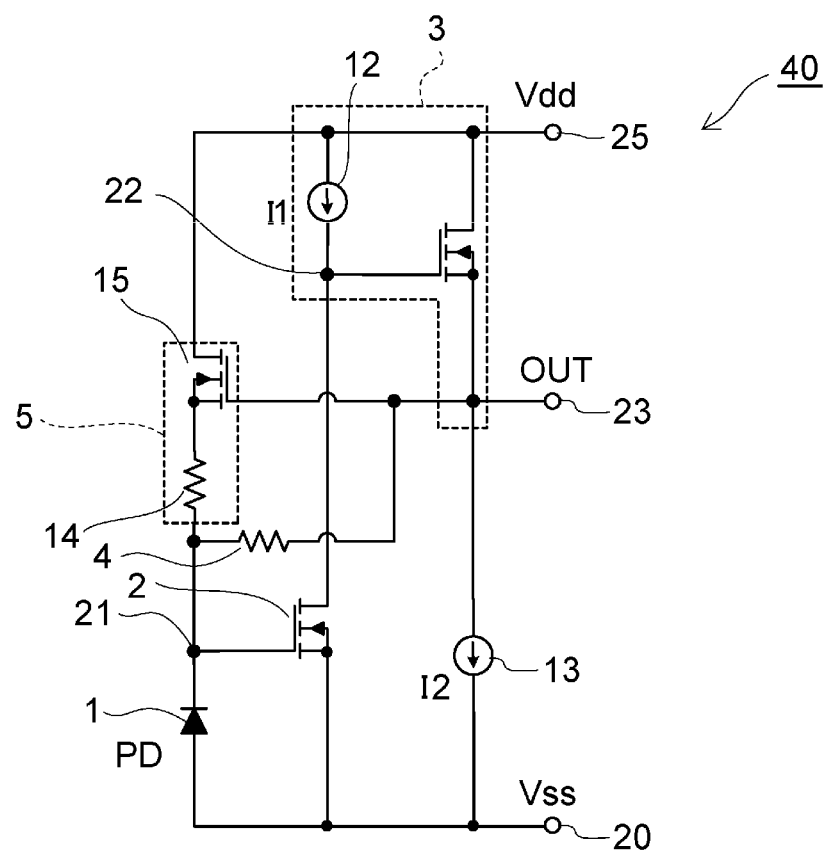
FIGS. 2A and 2B are circuit diagrams illustrating a light receiving circuit according to a first and a second comparison example, respectively.

As illustrated in FIG. 2A, a light receiving circuit 40 according to the comparison example is different from the light receiving circuit 10 in that the light receiving circuit 40 does not include the by-pass circuit 6 that is connected to the internal output node 22, and the by-pass control circuit 7. The other circuit elements and connections of the light receiving circuit 40 according to the comparison example are, in general, the same as those of the light receiving circuit 10t. Thus, the same symbols or reference numerals as in the light receiving circuit 10 depicted in FIG. 1 are used to indicate the same or substantially similar circuit elements and connections in the light receiving circuit 40 depicted in FIG. 2A, and detailed description of repeated or common elements may be omitted.

In the light receiving circuit 40, there is no means for suppressing a change in an equivalent feedback resistance that is generated when the limiter transistor 15 turns on, a resistance value of the equivalent feedback resistance is therefore rapidly decreased and gain is rapidly increased. In the light receiving circuit 40, a pole set by a capacitor present between the terminal of the light receiving element 1 and an equivalent feedback resistance is near a pole of the inverting amplifier, which includes the inverting amplification transistor 2, the load circuit 3, and the current source 13, and thus stability of the system is decreased.

Figure 2B:
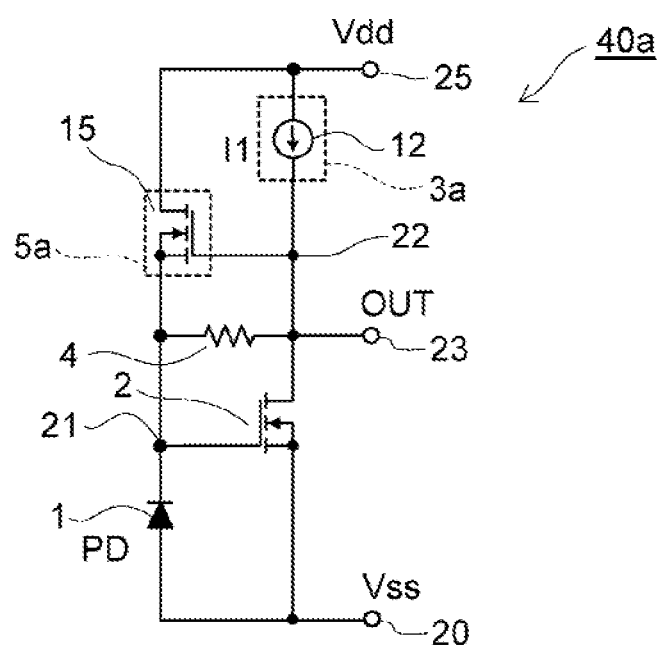

The stability of the system is determined substantially by the characteristics of an input stage, and thus is different from that of a configuration of the load circuit. As illustrated in FIG. 2B, a light receiving circuit 40a in which a load circuit 3a is configured with a current source 12 that is connected between the power supply potential 25 and the output node 23, and both a load transistor 11, and the current source 13 configuring a source follower are removed, is the same as a case of the light receiving circuit 40. That is, in the light receiving circuit 40 according to the comparison example, at the same time as the limiter transistor 15 starts operating, the value of the equivalent feedback resistance decreases, and a pole which is set by a capacitor present between the equivalent feedback resistance and the terminal of the light receiving element 1 is at a position near a pole of the inverting amplifier, which is configured with the inverting amplification transistor 2 and the load circuit 3a. Thus, stability of the system is decreased. In addition, in a case of FIG. 2B, a limiter circuit 5a is also simplified and without the feedback resistor 14, but a gate-source voltage of the limiter transistor 15 clamps a voltage across the feedback resistor 4, thereby being a cause of the unstable system, in the same manner as described above.

Figure 3A:
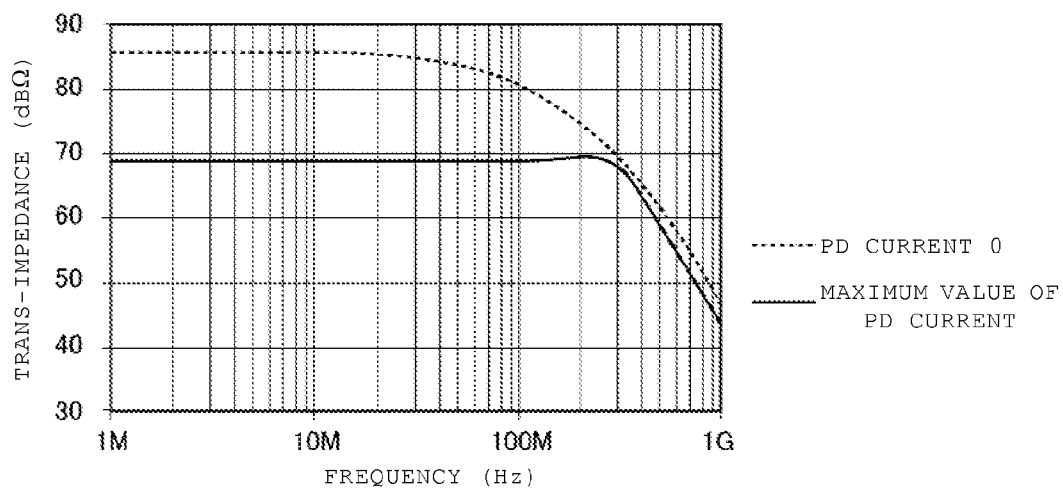
FIG. 3A is a graph obtained by a simulation illustrating frequency characteristics of a trans-impedance of the light receiving circuit of FIG. 1.

As illustrated in FIG. 3A, in the light receiving circuit 10, if there is no signal, the limiter circuit 5 does not operate, and thus the frequency characteristics of trans-impedance are represented by stable characteristics in a flat manner over a substantial frequency range. In addition, even if the limiter circuit 5 is operated by a maximum current that flows through the light receiving element 1, the frequency characteristics of the trans-impedance are substantially flat over a substantial frequency range, and the light receiving circuit 10 maintains a stable operation over this frequency range.

Figure 3B:
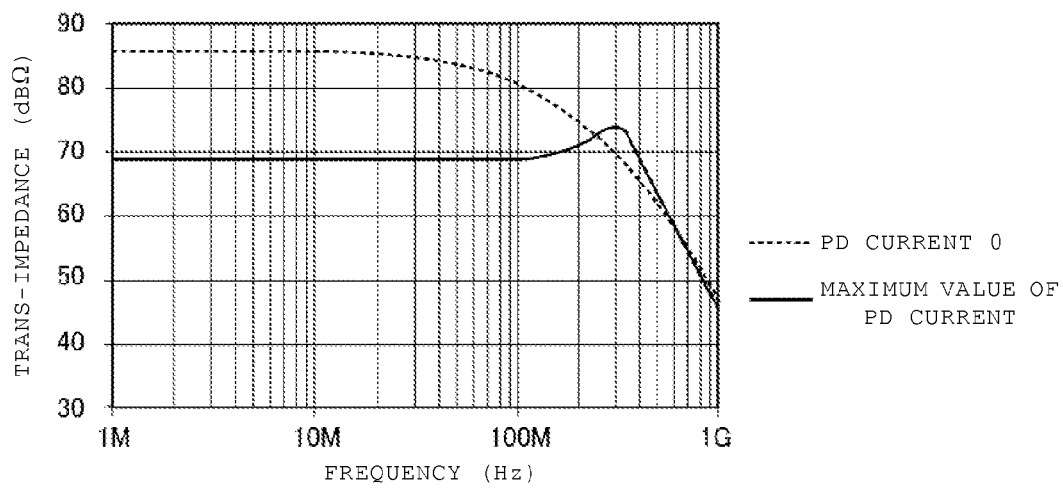
FIG. 3B is a graph, which is obtained by a simulation, illustrating frequency characteristics of a trans-impedance of the light receiving circuit according to the comparison example.

As illustrated in FIG. 3B, in the light receiving circuit 40 according to the comparison example, if there is no signal, the limiter circuit 5 does not operate, and thus the frequency characteristics of the trans-impedance are represented by stable characteristics in a flat manner over a substantial frequency range, in the same manner as the light receiving circuit 10. However, if the limiter circuit 5 is operated by a maximum current that flows through the light receiving element 1, a peak appears in the frequency characteristics of the trans-impedance, and the light receiving circuit 40 according to the comparison example has an unstable state in which a high frequency oscillation or the like can occur.

FIRST MODIFICATION EXAMPLE OF FIRST EMBODIMENT

Figure 4:
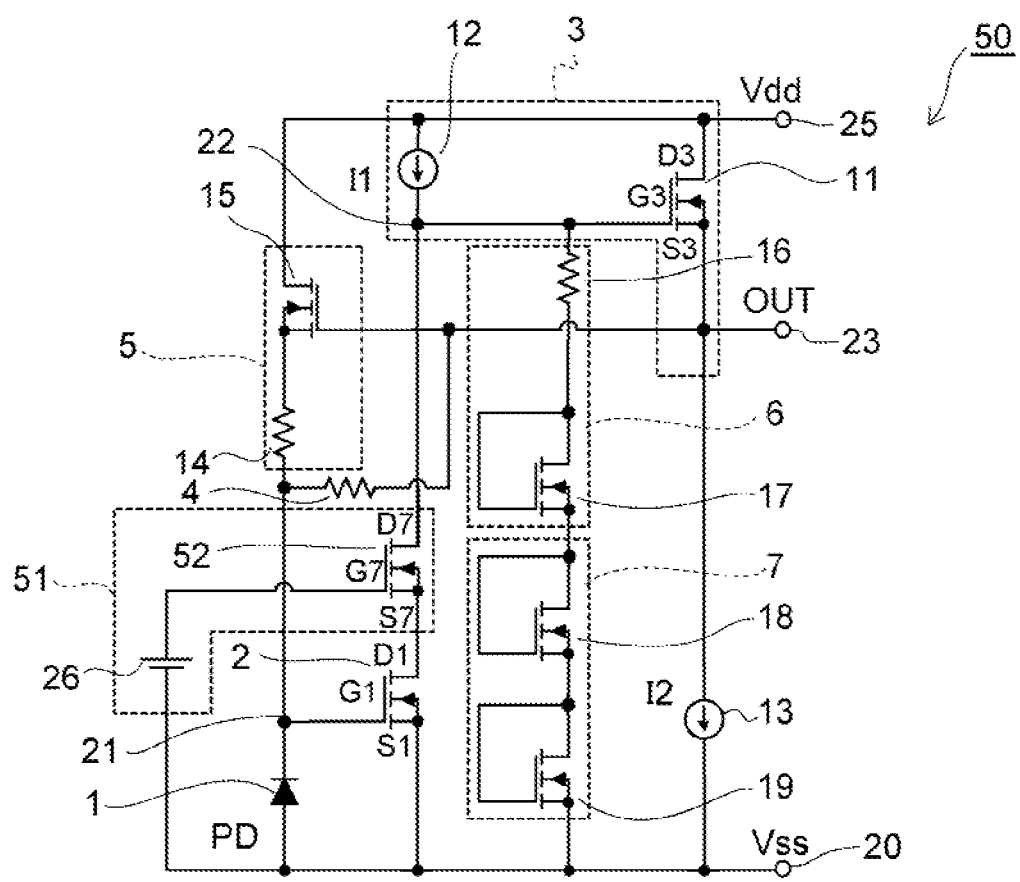
FIG. 4 is a circuit diagram illustrating a light receiving circuit according to a first modification example of the first embodiment.

FIG. 4 is a circuit diagram illustrating a light receiving circuit according to a first modification example of the first embodiment.

A light receiving circuit 50 according to the modification example is different from the light receiving circuit 10 according to the first embodiment in that the light receiving circuit 50 includes a gate ground amplification circuit 51 which is connected between a drain terminal D1 of an inverting amplification transistor 2 and an internal output node 22. Hereinafter, the same symbols or reference numerals as in the light receiving circuit 10 according to the first embodiment are attached to the same circuit elements and connections as in the light receiving circuit 50, and detailed description thereof is omitted.

The gate ground amplification circuit 51 includes a bias potential 26 and a cascode transistor 52. The bias potential 26 is connected to the reference potential 20, and provides an appropriate DC (direct current) bias to the gate ground amplification circuit 51. The cascode transistor 52 has a source terminal S7 that is connected to the drain terminal D1 of the inverting amplification transistor 2 and a drain terminal D7 that is connected to the internal output node 22. The gate ground amplification circuit 51 is connected to the drain terminal D1 side of the inverting amplification transistor 2 at a low impedance, and provides a high impedance to the internal output node 22. For this reason, the gate ground amplification circuit 51 may reduce a mirror capacitance of the inverting amplification transistor 2, and thus help improve characteristics of an inverting amplifier that includes the inverting amplification transistor 2, the gate ground amplification circuit 51, the load circuit 3, and the current source 13. In order to increase communication speed, it is necessary to broaden a bandwidth of a light receiving circuit, and by using the gate ground amplification circuit 51, it is possible to broaden the bandwidth of a light receiving circuit. By using the gate ground amplification circuit 51, it is possible to expand the bandwidth of the light receiving circuit, and by operating the by-pass circuit at the same time as the limiter circuit, it is possible to provide a stable operation of the light receiving circuit.

SECOND MODIFICATION EXAMPLE OF FIRST EMBODIMENT

Figure 5:
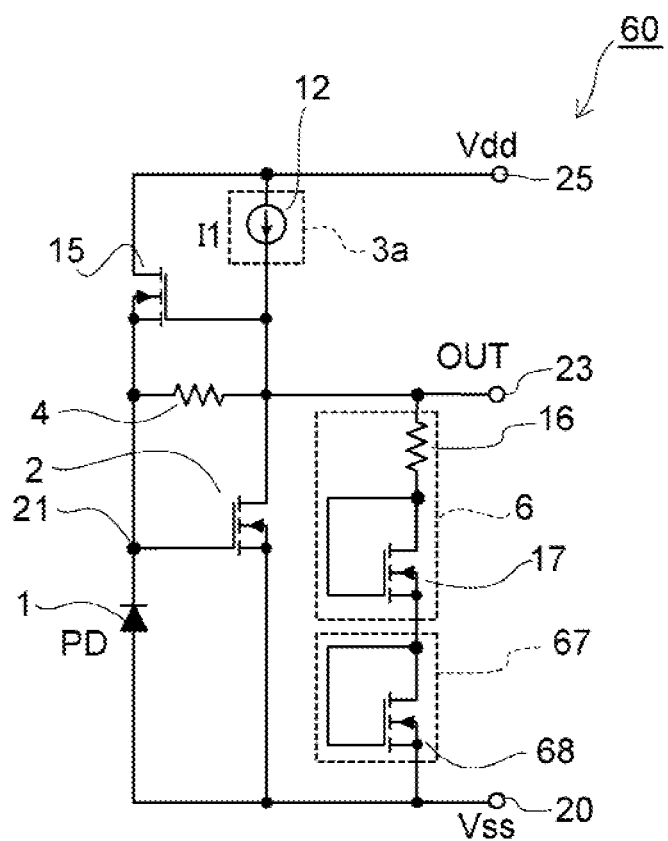
FIG. 5 is a circuit diagram illustrating a light receiving circuit according to a second modification example of the first embodiment.

FIG. 5 is a circuit diagram illustrating a light receiving circuit according to a second modification example of the first embodiment.

A light receiving circuit 60 according to this modification example is different from the light receiving circuit 10 according to the first embodiment, in view of structure of a load circuit 3a and a by-pass control circuit 67. Hereinafter, the same symbols or reference numerals as used in the light receiving circuit 10 according to the first embodiment are used represent the same circuit elements and connections as in the light receiving circuit 60, and detailed description thereof is omitted.

In the light receiving circuit 60 according to the second modification example, the load circuit 3a includes the current source 12, does not include the load transistor 11, and does not include the current source 13 that configures the current buffer together with the load transistor 11 in FIG. 4. In addition, the by-pass control circuit 67 includes one by-pass transistor 68 that is diode-connected, and does not include other by-pass transistors. The light receiving circuit 60 according to the second modification example is different from the light receiving circuit 10 according to the first embodiment in these two points. In addition, with regard to the second modification example, in the light receiving circuit 40a of FIG. 2B described in the comparison example, it may also be considered that the by-pass circuit 6 and the by-pass control circuit 67 are added between the output node 23 and the reference potential 20.

Even in the case of FIG. 5, if all transistors are MOSFETs and each threshold voltage is equal, when the sum of the gate-source voltage Vgs1 of the inverting amplification transistor 2 and the threshold voltage Vt2 of the limiter transistor 15 is equal to the sum of the threshold voltages of the two by-pass transistors 17 and 68, the limiter transistor 15 turns on. Thus, in the same manner as the light receiving circuit 10, when the limiter transistor 15 turns on, a path is formed from the internal output node 22 to the by-pass circuit 6. For this reason, a pole, which is formed by a capacitor formed between an equivalent feedback resistance and the terminal of the light receiving element 1, is formed near a pole of the inverting amplifier, which includes the inverting amplification transistor 2 and the load circuit 3a. Thus, the light receiving circuit 60 may stably operate.

In the light receiving circuit according to the present disclosure, the number of transistors included in the by-pass control circuit is adjusted so that it is possible to set an operation start voltage of the by-pass circuit 6. In the above examples, the number of transistors that are diode-connected is two or three, but according to the configuration of the load circuit, more transistors may also be used. For example, if the load circuit is configured with a plurality of transistors, and an operation voltage of the load circuit is set according to the gate-source voltages of the transistors, the transistors of the by-pass control circuit may be connected to as many as the number of transistors included in the load circuit. Even if the operation voltage is set according to gate-source voltages of transistors included in circuits other than the load circuit, the number of transistors of the by-pass control circuit is set to the number of the corresponding transistors, in the same manner as above.

Second Embodiment

In the example embodiments described above, by setting the threshold voltage of each transistor to be substantially equal, the by-pass transistor is turned on upon the operation start (turning on) of the limiter transistor, and the gain is decreased, thereby achieving the stable operation of the light receiving circuit. Actually, even if the threshold voltages of the transistors are equal, the inverting amplification transistor 2, the load transistor 11, and the limiter transistor 15 respectively have different operation states. That is, the inverting amplification transistor 2 or the load transistor 11 operates during a period from no load until the limiter transistor 15 operates, and the gate-source voltage is generated according to a current that is flowing. The characteristics of such a gate-source voltage are affected by the size of the transistor. Thus, in order to more precisely form a by-pass path of the internal output node 22 by turning on the by-pass circuit at the same time as the operation start of the limiter transistor, the currents may flow in advance through the by-pass transistors 18 and 19 of the by-pass control circuit 7, in such a manner that the gate-source voltages which are determined by the currents flowing through the inverting amplification transistor 2 and the load transistor 11 are substantially equal. In addition, in the present disclosure, if the transistor is an MOSFET, the transistor size is represented by gate width W/gate length L (gate width W divided by gate length L).

Figure 6:
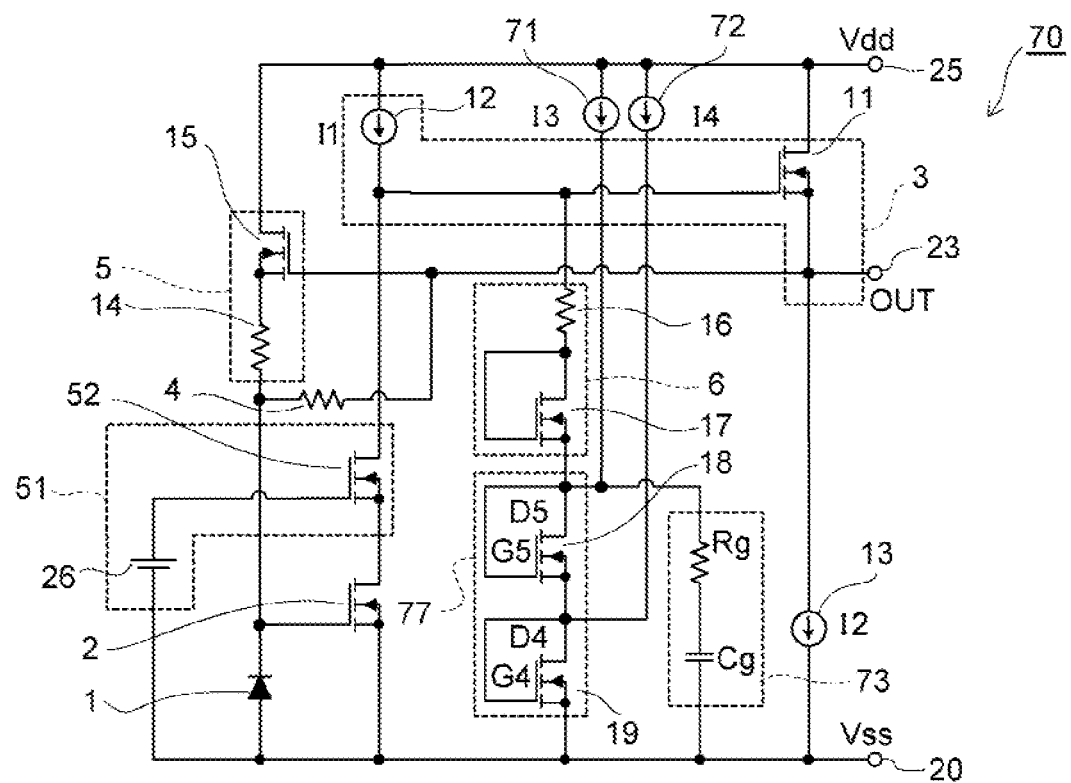
FIG. 6 is a circuit diagram illustrating a light receiving circuit according to a second embodiment.

As illustrated in FIG. 6, in a light receiving circuit 70 according to a second embodiment, in order to achieve a higher operation frequency, a gate ground amplification circuit (cascode current follower) 51 is used. The light receiving circuit 70 is different from the light receiving circuit 50 according to the first modification example of the first embodiment in that the light receiving circuit 70 further includes a third current source 71 and a fourth current source 72. Hereinafter, the same symbols or reference numerals as used in the first embodiment represent the same circuit elements and connections in the second embodiment and detailed description thereof are omitted.

The current source (I3) 71 is connected between the power supply potential 25, and a gate terminal G5 and a drain terminal D5 of the by-pass transistor 18, that is, to an anode side of the diode. A current value of the current source 71 is set in such a manner that the gate-source voltage of the by-pass transistor 18 is substantially equal to the gate-source voltage of the load transistor 11. The current source (I4) 72 is connected between the power supply potential 25, and a gate terminal G4 and a drain terminal D4 of the by-pass transistor 19, that is, to an anode side of the diode. A current of the current source 72 flows through the by-pass transistor 19 adding to the current of the current source 71. The sum of the current values of the current source 71 and the current source 72 is set in such a manner that the gate-source voltage of the by-pass transistor 19 is substantially equal to the gate-source voltage of the inverting amplification transistor 2.

As described above, by setting the currents flowing through the by-pass transistors 18 and 19, it is possible to make the voltage value of the internal output node 22 at the time of no signal substantially equal to the voltage value across the by-pass control circuit 77. Since the threshold voltages of the limiter transistor 15 and the by-pass transistor 17 are equal, the by-pass transistor 17 maybe turned on at the same time when the limiter transistor 15 turns on.

More generally, if the gate-source voltage of the MOSFET is constant, the drain current at the time is proportional to the transistor size, and may be calculated as follows:

$$(W1/L1):(W4/L4)=I1:(I3+I4) \quad (2)$$

$$(W3/L3):(W5/L5)=I2:I3 \quad (3)$$

Here, W1/L1 is a transistor size of the inverting amplification transistor 2, and W3/L3 is a transistor size of the load transistor 11. W4/L4 and W5/L5 are transistor sizes of the by-pass transistors 18 and 19, respectively.

In addition, in the light receiving circuit according to the second embodiment, the gate-source voltage of the by-pass transistor may coincide with at least one of the gate-source voltages of the inverting amplification transistor 2 and the load transistor 11. Thus, in the light receiving circuit 70, any one of the two current sources I3 and I4 may be connected.

By connecting the by-pass control circuit 77 in parallel with an RC circuit 73, it is possible to arbitrarily set a value of the load resistor together with the resistor 16 when the by-pass circuit 6 and the by-pass control circuit 77 operate, and thus the light receiving circuit 70 may operate more stably. Here, Cg and Rg form a "zero" point together with the resistor 16, and contribute to a stable operation. The RC circuit 73 may be used together with the resistor 16, in the light receiving circuit 10 according to the first embodiment or in the modification examples.

In addition, in the light receiving circuit 70 illustrated in FIG. 6, in order to operate at a higher frequency, the cascode amplification circuit in which the gate ground amplification circuit 51 is cascode-connected to the inverting amplification transistor 2 is used, but a source ground amplification circuit which includes the inverting amplification transistor 2 may also be used. In addition, a structure of the load circuit is changed, and according to the structure of the load circuit, the number of transistors of the by-pass control circuit may be adjusted.

Third Embodiment

Figure 7:
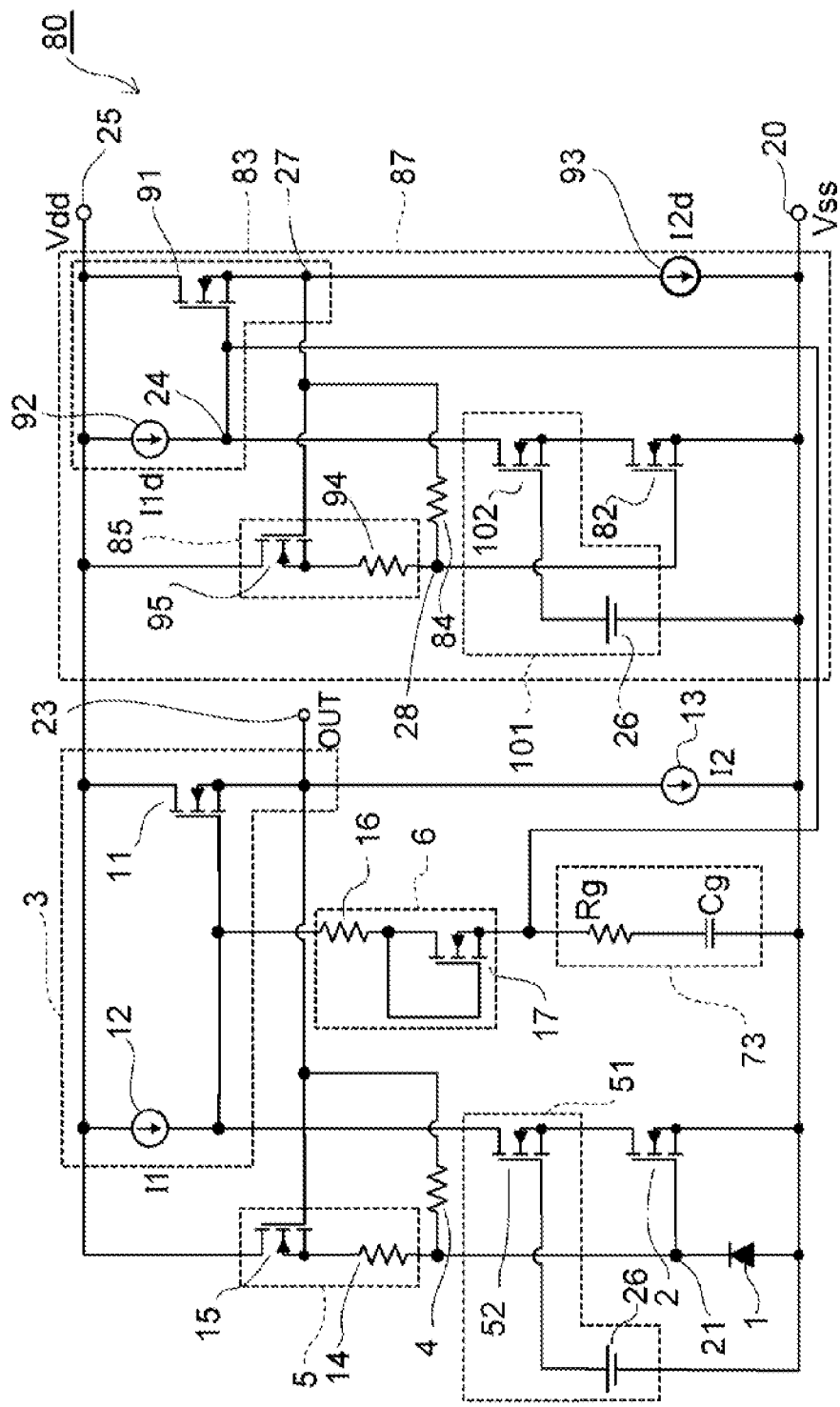
FIG. 7 is a circuit diagram illustrating a light receiving circuit according to a third embodiment.

FIG. 7 is a circuit diagram illustrating a light receiving circuit according to a third embodiment.

In the examples described above, a voltage by which the limiter transistor 15 turns on is detected using a gate-source voltage or a threshold voltage of another transistor that is used for a circuit, but may be set so as to operate a by-pass circuit by other means.

A light receiving circuit 80 according to a third embodiment uses a gate ground amplification circuit 51 at an input stage to obtain a higher frequency bandwidth, but the gate ground amplification circuit 51 may also be omitted.

As illustrated in FIG. 7, the light receiving circuit 80 according to the third embodiment includes a by-pass control circuit 87. The light receiving circuit 80 is different from the light receiving circuit 50 in that the light receiving circuit 80 includes the by-pass control circuit 87 instead of the by-pass control circuit 7 according to the first modification example of the first embodiment. Hereinafter, the same symbols or reference numerals as in the light receiving circuit 50 according to the first modification of the first embodiment are attached to the same circuit elements and connections as in the light receiving circuit 80, and detailed description thereof are omitted.

The by-pass control circuit 87 is a "dummy" circuit that is not directly related to an output of the light receiving circuit. The by-pass control circuit 87 includes an inverting amplification transistor (dummy) 82, a load circuit (dummy) 83, and a feedback resistor (dummy) 84.

The inverting amplification transistor (dummy) 82 is connected between a node 24 corresponding to the internal output node 22, and the reference potential 20, in the same manner as the inverting amplification transistor 2.

The load circuit (dummy) 83 includes a load transistor (dummy) 91, and a current source (dummy) 92. The load transistor (dummy) 91 is connected between the power supply potential 25 and a node 27 corresponding to the output node 23, in the same manner as the load transistor 11. The current source (dummy) 92 is connected between the power supply potential 25 and the node 27, in the same manner as the current source 12. The current source (dummy) 93 is connected between the node 27 and the reference potential 20, in the same manner as the current source 13.

The feedback resistor (dummy) 84 is connected between a node 28 corresponding to the input node 21, and the node 27, in the same manner as the feedback resistor 4.

The light receiving circuit 80 according to the present embodiment may use a limiter circuit (dummy) 85. The limiter circuit (dummy) 85 includes the feedback resistor (dummy) 84 and a limiter transistor (dummy) 95. The feedback resistor (dummy) 84 is connected between a source terminal of the limiter transistor (dummy) 95 and the node 28, in the same manner as the feedback resistor 14.

Gate-source voltage of each transistor in the by-pass control circuit 87 is set by current values of the current sources (dummy) 92 and 93, respectively, so as to be substantially equal to gate-source voltages of the corresponding transistors. By setting in such away, in a state before an operation of the limiter circuit 5, a voltage value of the node 24 is equal to the voltage value of the internal output node 22, and thus, the by-pass circuit 6 does not operate.

A voltage value of the source terminal of the by-pass transistor 17 is determined by the sum of the gate-source voltages of the inverting amplification transistor (dummy) 82 and the load transistor (dummy) 91, and thus the limiter transistor 15 and the by-pass transistor 17 turn on simultaneously. For this reason, the current flowing out of the internal output node 22 flows through the by-pass circuit 6. Thus, in the light receiving circuit 80, the gain is reduced by decreasing the impedance of the internal output node 22, whereby a stable operation is achieved. In addition, the same operation as in the internal output node 22 is performed in the node 24, and thus the dummy circuit side also is not a cause of instability. As the light receiving circuit 80 includes the by-pass control circuit 87, bias setting of the by-pass transistor 17 may be performed more precisely, whereby more stable operation may be performed.

In the same manner as the third embodiment, the RC circuit 73 is connected between the by-pass transistor 17 and the reference potential 20. By connecting the RC circuit 73, the resistor 16 may be arbitrarily set, and thus light receiving circuit 80 may perform more stable operation.

Fourth Embodiment

Figure 8A:
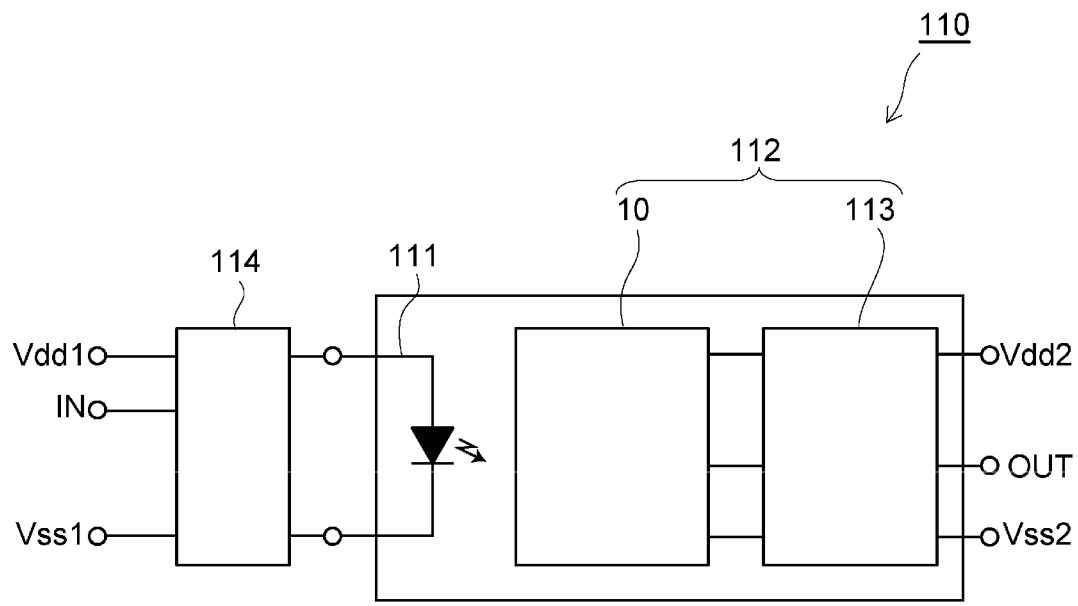
FIG. 8A is a block diagram illustrating a light coupling device according to a fourth embodiment.
Figure 8B:
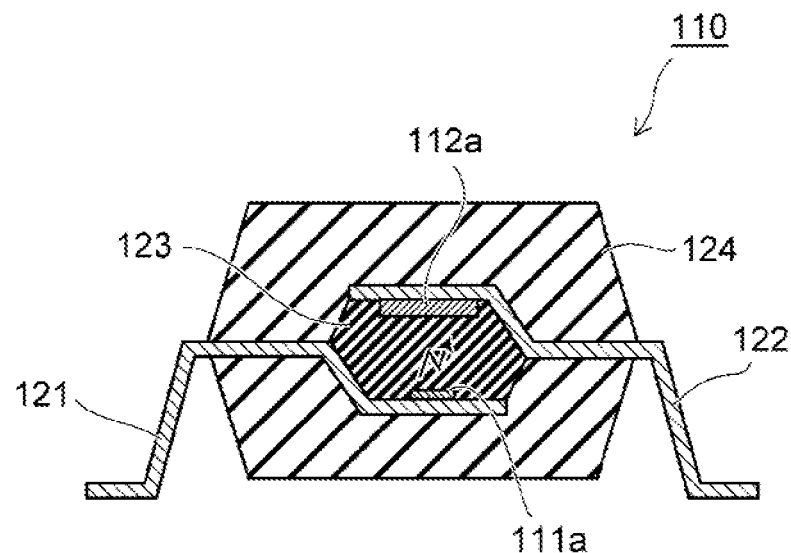
FIG. 8B is a cross-sectional view illustrating a structure of the light coupling device according to the fourth embodiment.

FIG. 8A is a block diagram illustrating a light coupling device according to a fourth embodiment. FIG. 8B is a cross-sectional view illustrating a structure of the light coupling device according to the fourth embodiment.

The various light receiving circuits described above is used together with a light transmitting circuit that transmits a light signal, and may be used for a light coupling device 110. The light coupling device 110 is used in environment or the like where it is difficult to transmit a signal by directly connecting an electric circuit due to a different voltage level between an input and an output. The light coupling device 110 is, for example, a photocoupler.

As illustrated in FIG. 8A, the light coupling device 110 includes a light emitting element 111 and a receiving circuit 112.

The light emitting element 111 is an infrared emitting diode including, for example, AlGaAs or the like. The light emitting element 111 is driven by a driving circuit 114. The driving circuit 114 is connected to an external power supply that outputs, for example, voltage Vdd1 or Vss1, and a signal is input from a signal input terminal IN. The light emitting element 111 emits light according to an input signal and accordingly transmits a light signal to the light receiving circuit 10. Vdd1 is, for example, +5V, and Vss1 is, for example, −5 V.

In an embodiment, the receiving circuit 112 includes the light receiving circuit 10 described above. A light receiving circuit such as light receiving circuit 50, 60, 70, or 80 may be incorporated into the receiving circuit 112 in place of or in addition to light receiving circuit 10. In this embodiment, the light receiving circuit 10 converts the received light signal into a current using the light receiving element 1, converts the converted current into a voltage using a trans-impedance amplifier including the feedback resistor 4 and the inverting amplifier configured with the inverting amplification transistor 2, the load circuit 3, and the current source 13, and outputs the converted voltage. The receiving circuit 112 may further include a waveform shaping circuit 113. The waveform shaping circuit 113 is connected to an output of the light receiving circuit 10. The waveform shaping circuit 113 includes a comparator having a predetermined threshold voltage, for example. The waveform shaping circuit 113 compares an analog voltage signal output from the light receiving circuit 10 with a threshold voltage, converts the analog voltage signal into a digital signal, and outputs the digital signal from an output terminal OUT. The light receiving circuit 10 and the waveform shaping circuit 113 may be preferably design to operate using a common power supply, and operation voltages are Vdd2 and Vss2. Vdd2 is, for example, 3.3 V, and Vss2 is, for example, 0 V.

As illustrated in FIG. 8B, the light coupling device 110 includes a lead frame 121 on which a light emitting element chip 111a having a light emitting element 111 formed on a semiconductor substrate thereof is mounted and which is connected to the light emitting element chip 111a by bonding wires (not specifically illustrated), and a lead frame 122 on which a receiving circuit chip 112a having the receiving circuit 112 formed on a semiconductor substrate thereof is mounted and which is connected to the receiving circuit chip 112a by bonding wires (not specifically illustrated). The lead frames 121 and 122 are disposed so as to face the surfaces, which are mounted on the lead frames 121 and 122, of the light emitting element chip 111a and the receiving circuit chip 112a. A portion of the light emitting element chip 111a and the receiving circuit chip 112a that are disposed so as to face the lead frames 121 and 122 is covered with transparent resin in consideration of light transmission loss. The chips (111a & 112a) and portions of the lead frames are sealed within an epoxy-based light-shielding resin, for example, using a transfer mold technology or the like. The light coupling device 110 is electrically connected to the driving circuit 114 using leads of the lead frame 121 on which the light emitting element chip 111a is mounted, and obtains output signals from leads of the lead frame 122 on which the receiving circuit chip 112a is mounted.

The light coupling device 110 includes the light receiving circuit 10 that may stably operate in a wide band, and thus, in a wide dynamic range from a weak amplitude signal to a large amplitude signal.

Fifth Embodiment

Figure 9:
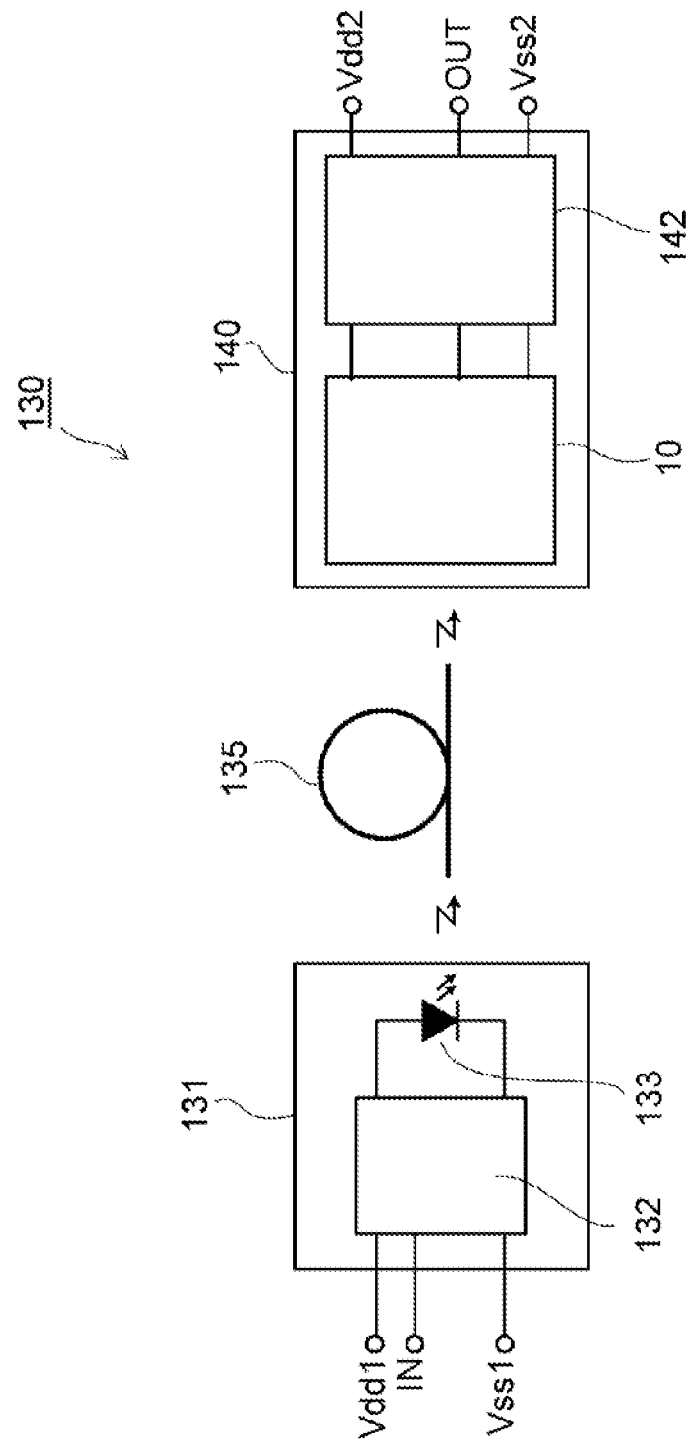
FIG. 9 is a block diagram illustrating a light communication system according to a fifth embodiment.

FIG. 9 is a block diagram illustrating a light communication system according to a fifth embodiment.

A light receiving circuit 10 is used together with a transmission circuit that transmits a light signal, and may be used in a light communication system 130. The light communication system 130 receives a light signal that is transmitted via an optical fiber 135, converts the received light signal into an electrical signal, and outputs the electrical signal.

The light communication system 130 includes a transmission device 131, an optical fiber 135, and a receiving device 140. The transmission device 131 includes a driving circuit 132, and a light emitting element 133 that is driven by the driving circuit 132. The light emitting element 133 of the transmission device 131 is optically coupled to an end portion of the optical fiber 135 and emits a light signal according to the driving circuit 132. The receiving device 140 includes light receiving circuit 10 and a waveform shaping circuit 142 that converts an analog signal output from the light receiving circuit 10 into a digital signal. The other end portion of the optical fiber 135 is optically coupled to a light receiving element 1 in the light receiving circuit 10 of the receiving device 140, and receives the light signal that is transmitted via the optical fiber 135. The light receiving circuit 10 converts the light signal into an analog electric signal, and outputs the converted electric signal to the waveform shaping circuit 142.

The light communication system 130 includes the light receiving circuit 10 that stably operates at a wide band in a wide dynamic range, and thus, a communication distance may be increased, and even if the transmission loss of a transmission line is large, the light communication system 130 receives the light signal with a high gain, and may stably operate.

In all embodiments described above, a MOSFET is used for a transistor, but one or more transistors may be replaced with bipolar transistors. A base terminal (control terminal) of the bipolar transistor corresponds to a gate terminal of the MOSFET. An emitter terminal (first terminal) of the bipolar transistor corresponds to a source terminal of the MOSFET. A collector terminal (second terminal) of the bipolar transistor corresponds to a drain terminal of the MOSFET.

Threshold voltages between the base and the emitter of each bipolar transistor are intrinsically equal to each other regardless of the design of a transistor, and a transistor size and current density that are represented by an emitter area may be appropriately set, whereby the similar results as that of the other example embodiments may be obtained.

In addition, while the illustrated transistors are depicted as N channel (NPN) transistors, by using a transistor with a reverse polarity, that is, a P channel (PNP) transistor, the light receiving circuits may be configured in a similar manner as to the examples. If a transistor with a reverse polarity is used, a current source may also be configured with a unit with a reverse polarity.

According to the embodiments described above, it is possible to achieve a light receiving circuit and a light coupling device which stably operate in a wide dynamic range.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light receiving circuit, comprising:
    a light receiving element connected to a first node;
    a first transistor having a control terminal connected to the light receiving element through the first node, a first terminal connected to a first reference potential, and a second terminal connected to a second node;
    a first load circuit connected between the second node and a first power supply potential that is higher than the first reference potential, the first load circuit configured to output a voltage signal to a third node, the voltage signal corresponding to a current signal generated by the light receiving element;
    a first feedback resistor connected between the first node and the third node;
    a first limiter circuit connected in parallel with the first feedback resistor and configured to limit an increase in voltage across the first feedback resistor; and
    a second transistor that is diode-connected and connected between the second node and the first reference potential.

2. The light receiving circuit according to claim 1, wherein the first limiter circuit includes a third transistor having a control terminal connected to the third node and a first terminal connected to the first node.

3. The light receiving circuit according to claim 2, further comprising:
    a fourth transistor connected between the second transistor and the first reference potential, the fourth transistor being diode-connected and in series with the second transistor.

4. The light receiving circuit according to claim 3, wherein the first load circuit includes a first current source.

5. The light receiving circuit according to claim 4, wherein
    the first load circuit includes a fifth transistor having a control terminal connected to the second node and a first terminal connected to the third node, and
    a sixth transistor is connected between the fourth transistor and the first reference potential, the sixth transistor being diode-connected and in series with fourth transistor.

6. The light receiving circuit according to claim 5, further comprising:
    a second current source configured to supply a current to at least one of the fourth and sixth transistors.

7. The light receiving circuit according to claim 2, wherein a plurality of diode-connected transistors are connected in series between the second transistor and the first reference potential.

8. The light receiving circuit according to claim 1, further comprising:
    a fourth transistor having a first terminal connected to the first reference potential and a second terminal connected to the second transistor;
    a second load circuit connected between the first power supply potential and a fourth node that is connected to the second terminal of the fourth transistor, the second load circuit having a fifth node at which a signal is output to the fourth node; and
    a second feedback resistor connected between a control terminal of the fourth transistor and the fifth node.

9. The light receiving circuit according to claim 1, further comprising:
    an amplification circuit having a low input impedance and a high output impedance, the amplification circuit connected between the second node and the second terminal of the first transistor.

10. The light receiving circuit according to claim 1, further comprising:
    a capacitor and a resistor connected in series between the second transistor and the first reference potential.

11. The light receiving circuit according to claim 1, wherein the first and second transistors are metal-oxide-semiconductor field effect transistors (MOSFETs).

12. An optical coupler, comprising:
    a light emitting element; and
    a light receiving circuit including:
        a light receiving element connected to a first node and configured to receive light which is emitted from the light emitting element and to generate a current signal at the first node corresponding to light received from the light emitting element;
        a first transistor having a control terminal connected to the first node, a first terminal connected to a first reference potential, and a second terminal connected to a second node;
        a first load circuit connected between the second node and a first power supply potential that is higher than the first reference potential and configured to output a voltage signal to a third node, the voltage signal corresponding to the current signal generated by the light receiving element;
        a first feedback resistor connected between the first node and the third node;
        a first limiter circuit connected in parallel with the first feedback resistor and configured to limit an increase in voltage across the first feedback resistor; and
        a second transistor that is diode-connected and connected between the second node and the first reference potential.

13. The optical coupler according to claim 12, wherein the light receiving element is a photodiode.

14. The optical coupler according to claim 12, wherein the light receiving element is connected to the light emitting element by an optical fiber.

15. A light receiving circuit, comprising:
- a light receiving element connected to a first node and configured to output a current signal to the first node, the current signal corresponding to light incident on the light receiving element;
- an amplifier circuit connected to the first node and configured to amplify the current signal received at the first node and output an amplified current signal at a second node;
- a load circuit connected to the second node and configured to provide a load for the amplifier circuit;
- a feedback circuit connected between the first node and a third node;
- a limiter circuit configured to limit a voltage across the feedback circuit; and
- a first resistor and a first diode-connected transistor connected in series to the second node.

16. The light receiving circuit according to claim 15, wherein
- the amplifier circuit includes a first transistor having a control terminal connected to the first node, a first terminal connected to a first reference potential, and a second terminal connected to the second node;
- the load circuit includes a current source connected between a first power supply potential and the second node;
- the feedback circuit is a second resistor;
- the limiter circuit includes a second transistor having a control terminal connected to the second node, a first terminal connected to the first power supply potential, and a second terminal connected to the first node; and
- the third node is connected to the second node.

17. The light receiving circuit according to claim 15, wherein
- the amplifier circuit includes a first transistor having a control terminal connected to the first node, a first terminal connected to a first reference potential, and a second terminal providing an amplified output;
- the load circuit includes a current source and a second transistor, the current source connected between a first power supply potential and the second node, the first power supply potential being higher than the first reference potential, and the second transistor having a control terminal connected to the second node, a first terminal connected the third node, and a second terminal connected to the first power supply potential;
- the feedback circuit is a second resistor connected between the third node and the first node; and
- the limiter circuit includes a third resistor and a third transistor, the third transistor having a control terminal connected to the third node, a first terminal connected to the first power supply potential, and a second terminal of the third transistor being connected to the third resistor that is connected to the first node.

18. The light receiving circuit according to claim 15, wherein the amplifier circuit further includes a fifth transistor configured as a cascode current follower to the first transistor in the amplifier circuit.

19. The light receiving circuit according to claim 15, further comprising:
- a second diode-connected transistor connected in series with the first diode-connected transistor, the first resistor being between the second diode-connected transistor and the second node.

20. The light receiving circuit according to claim 15, further comprising:
- a dummy bypass control circuit connected between the first power supply potential and the first reference potential.

* * * * *